(12) United States Patent
Yoshida

(10) Patent No.: US 6,333,237 B1
(45) Date of Patent: Dec. 25, 2001

(54) METHOD FOR MANUFACTURING A SEMICONDUCTOR DEVICE

(75) Inventor: Hiroshi Yoshida, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/531,690

(22) Filed: Mar. 20, 2000

(30) Foreign Application Priority Data

Mar. 25, 1999 (JP) .................................................. 11-081665

(51) Int. Cl.$^7$ ................ H01L 21/8228; H01L 21/8224; H01L 21/8238; H01L 21/8222

(52) U.S. Cl. ..................... 438/322; 438/203; 438/336; 438/340

(58) Field of Search ..................... 438/322, 336, 438/338, 340, 342, 202, 203, 205, 206

(56) References Cited

U.S. PATENT DOCUMENTS

| | | | |
|---|---|---|---|
| 4,855,245 | * | 8/1989 | Neppl et al. . |
| 4,926,235 | * | 5/1990 | Tamaki et al. ........................ 257/518 |
| 4,949,145 | * | 8/1990 | Yano et al. ........................... 257/370 |
| 5,407,840 | * | 4/1995 | Manoliu et al. ...................... 438/202 |
| 5,686,322 | * | 11/1997 | Beasom ................................. 438/322 |
| 6,117,716 | * | 9/2000 | Manning ............................... 438/202 |

FOREIGN PATENT DOCUMENTS

| | | |
|---|---|---|
| 62-86753 | 4/1987 | (JP) . |
| 4-18752 | 1/1992 | (JP) . |

* cited by examiner

Primary Examiner—Matthew Smith
Assistant Examiner—Lex H. Malsawma
(74) Attorney, Agent, or Firm—McGinn & Gibb, PLLC

(57) ABSTRACT

A method for manufacturing a semiconductor device separately forms two collector regions, two base extension regions, two base regions, and two collector extension regions on a first bipolar transistor forming region and a second bipolar transistor forming region that are formed on a semiconductor substrate, and includes a step of forming an emitter region on the first bipolar transistor region and forming, in the same process step, a base contact layer for an emitter electrode in the second bipolar transistor region as well, after which an emitter electrode is formed on the base contact layer.

12 Claims, 11 Drawing Sheets

PRIOR ART MANUFACTURING METHOD

MANUFACTURING METHOD ACCORDING TO THE PRESENT INVENTION

METHOD FOR MANUFACTURING A SEMICONDUCTOR DEVICE

BACKGROUND OF THE INVENTION

1. Field of the Invention

The present invention relates to a method for manufacturing a semiconductor device in which a V-NPN and a V-PNP bipolar transistor are formed on one and the same substrate.

2. Background of the Invention

In the past, semiconductor devices in which a V-NPN and a V-PNP bipolar transistor are formed on one and the same substrate have been widely known. In these devices, the method of forming the emitter of a bipolar transistor is, for example, that of causing solid-phase diffusion of an impurity from a polysilicon layer into the single-crystal silicon layer (polysilicon emitter type, to be described herein).

Using the above-noted method, to form a V-NPN and a V-PNP transistor on a single substrate, n-type and p-type impurities are introduced into a prescribed region of a polysilicon layer, thereby requiring two masking processes.

To use the so-called SIC (selectively implanted collector) method, in which improves the transistor characteristics by increasing the concentration of collector impurity directly below the emitter region, in order to introduce an impurity into the V-NPN region the V-PNP region, it is necessary to have two additional masking processes, and the formation of high-performance V-NPN and V-PNP transistors on one and the same substrate is accompanied by the problem of a high number of masking steps.

An example of the past method of manufacturing a semiconductor device having a V-NPN and a V-PNP transistor formed on a single substrate and in which the above-noted SIC is formed directly below the emitter region is described below.

FIG. 17 through FIG. 25 are cross-section views of the manufacturing process steps that illustrate the past method of manufacturing.

First, as shown in FIG. 17, a field oxide film 2 that defines element separation is formed on a p-type silicon substrate 1, after which the substrate 1 is oxidized to form an oxide film 3 having a thickness of 50 to 200 Angstroms.

Then, an n-type collection region 4, a high-concentration p-type base extension region 5, a p-type base region 6, and a high-concentration n-type collection extension region 7 of a V-NPN bipolar transistor, and an n-type element separation region 8, a p-type collection region 9, a high-concentration n-type base extension region 10, an n-type base region 11, and a high-concentration p-type collector extension region 12 of a V-PNP bipolar transistor are formed, respectively.

Next, as shown in FIG. 18, etching operation is performed using the resist film 38 formed on the oxide film 13 having a thickness of 500 to 1000 Angstroms and formed over the entire surface of the substrate, as a mask, thereby removing the oxide films 3 and 13, so as to form an emitter contact 15 of the V-NPN transistor and an emitter contact 39 of the V-PNP transistor.

Next, as shown in FIG. 19, resist 40 is used as a mask to ion implant phosphorus, using an energy of 200 to 400 keV, with a dose of 1 to $5 \times 10^{12}$ cm$^{-2}$ thereby forming an n-type SIC region 16.

Next, as shown in FIG. 20, resist 41 is used as a mask to ion implant boron, using an energy of 60 to 150 keV, with a dose of 1 to $5 \times 10^{12}$ cm$^{-2}$, thereby forming a p-type SIC region 37.

Next, as shown in FIG. 21, a polysilicon layer 17 having a thickness of 2000 to 3000 Angstroms is formed over the entire substrate surface, including the emitter contacts 15 and 39.

Next, as shown in FIG. 22, resist 42 is used as a mask to ion implant boron with a dose of 1 to $2 \times 10^{16}$ cm$^{-2}$.

Next, as shown in FIG. 23, resist 43 is used as a mask to ion implant arsenic with a dose of 1 to $2 \times 10^{16}$ cm$^{-2}$.

Next, as shown in FIG. 24, resist 43 is used as a mask to etch the polysilicon layer 17 so as to form an emitter electrode 20 of an V-NPN transistor and an emitter electrode 44 of a V-PNP transistor.

After the above, heat treating at 900 to 1000° C. is performed in an atmosphere of nitrogen to cause diffusion of impurities in the polysilicon layers 17 and 25, thereby forming an n-type emitter region 27 and a p-type emitter region 28.

Next, in an interlayer insulation film 29 formed over the elements formed by the above-noted process steps, a contact 30 is formed, after which a plug 31 is formed of tungsten or the like, and metal interconnects 32 are formed, thereby achieving the semiconductor device shown in FIG. 25.

In the above-noted method of manufacturing, in order to improve the transistor characteristics, an SIC region is formed in both the V-NPN transistor and the V-PNP transistor. The conductivity types of the impurity that is ion implanted into these regions are different, and two masking operations are required to form the SIC (FIG. 19 and FIG. 20).

Additionally, the formation of the emitter electrode 20 also requires different masking operations in which ion implantation must be done, respectively (FIG. 22 and FIG. 23).

In the prior art method such as described above, there exists the problem of requiring a large number of masking process steps in order to form a V-NPN transistor and a V-PNP transistor on a single substrate.

In Japanese Unexamined Patent Publications (KOKAI) No. 62-86753 and No. 4-18752, there is language describing a semiconductor device in which an NPN transistor and a PNP transistor are formed on a single semiconductor substrate. However, there is no language with regard to a semiconductor device having an SIC, and no language with regard to reducing the number of process steps when manufacturing a semiconductor device having an SIC.

Accordingly, and in consideration of the above-noted drawbacks of the prior art, it is an object of the present invention to provide a method for manufacturing a semiconductor device having an NPN transistor and a PNP transistor, both of which have an SIC region, on one and the same substrate, featuring a shortened manufacturing process with greatly reduced manufacturing cost, without sacrificing performance.

SUMMARY OF THE INVENTION

In order to achieve the above-noted object, the present invention has the following basic technical constitution.

Specifically, a first aspect of a method for manufacturing a semiconductor device according to the present invention is one which, for manufacturing a semiconductor device having a first bipolar transistor of a first conductivity type and a second bipolar transistor of a second conductivity type on one and the same substrate and in mutual proximity, comprising the steps of;

forming on a semiconductor substrate a region for forming said first bipolar transistor and a region for forming said second bipolar transistor and minimally separately forming in each transistor forming region, a collector region, a base extension region, a base region, and a collector extension region;

covering the top of said semiconductor substrate with a first resist film and providing an aperture for an emitter contact in a part of the first resist film and corresponding to a base region of said first bipolar transistor;

implanting a first impurity from said aperture, so as to form an SIC region of said first conductivity type at the bottom of the base region;

forming a polysilicon layer over the entire surface of said semiconductor substrate, and then implanting a first impurity into said polysilicon layer;

forming a second resist film over the entire surface of said semiconductor substrate, and then patterning said polysilicon film so as to form in said first bipolar transistor formation region an emitter electrode part connected to said base region, and forming a mask layer that, in said second bipolar transistor formation region, covers a base region and the surrounding area, and that has a closed type aperture so as to expose at least a part of said base region in said second bipolar transistor formation region;

using said second resist film as a mask to implant a second impurity over the entire surface of said semiconductor substrate, and form an SIC region of a second conductivity type at the bottom of the base region in said second bipolar transistor region;

covering the entire surface of said semiconductor substrate with an insulation layer, and then removing said insulation layer by etching, so as to form a side wall on an emitter electrode part in said first bipolar transistor formation region and on said mask layer in said second bipolar transistor region;

forming a polysilicon layer over the entire semiconductor substrate, and then implanting into said polysilicon layer a second impurity;

forming a third resist film over the entire surface of said semiconductor substrate, and patterning said polysilicon layer, thereby forming an emitter region connected to said base region in said second bipolar transistor forming region; and heat treating said semiconductor substrate to form an emitter region of said first conductivity type and an emitter region of said second conductivity type.

In the prior art, in order to form a V-NPN bipolar transistor and an V-PNP bipolar transistor on one and the same substrate, it was necessary to add masking processes for ion implantation of n-type and p-type impurities, respectively, and thereby resulting in the problem of a large number of process steps.

In the present invention, however, a closed type aperture is provided and a polysilicon layer is formed in the V-PNP transistor base region in the same process step in which the emitter electrode of the V-NPN transistor is formed.

And thereafter, a polysilicon layer is formed.

This polysilicon layer and the resist formed over it are used as a mask to form a p-type SIC in the V-PNP transistor.

After forming side walls on an insulation film made of the polysilicon layer, to a polysilicon film thus grown again over the entire area, an ion implanting operation will be carried out with boron or $BF_2$, and this is patterned to form an emitter electrode of the V-PNP transistor so as to reduce the number of masking process steps.

DESCRIPTION OF THE PREFERRED EMBODIMENTS

Figure 1:
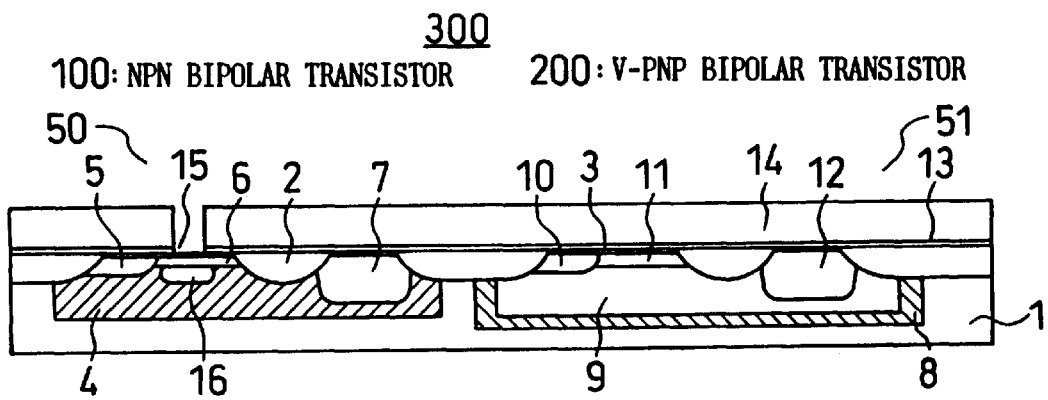
FIG. 1 is a cross-section view showing the main process steps in an example of a method for manufacturing a semiconductor device according to the present invention.

Embodiments of a method of manufacturing a semiconductor device according to the present invention are described in detail below, with reference made to relevant accompanying drawings.

Specifically, FIG. 1 to FIG. 8 are cross-section views showing an example of a method for manufacturing a semiconductor device 300 according to the present invention, which is provided with a first bipolar transistor 100 of a first conductivity type and a second bipolar transistor 200 of a second conductivity type on one and the same substrate 1 and in mutual proximity, comprises the steps of forming on a semiconductor substrate 1, a region 50 for forming the first bipolar transistor 100 and a region 51 for forming the second bipolar transistor 200, respectively, and forming separately, in each transistor forming region 50 and 51, at least collector regions 4 and 9, base extension regions 5 and 10, base regions 6 and 11, and collector extension regions 7 and 12, respectively, covering the top of the semiconductor substrate 1 with a first resist film 14 and providing an aperture 15 for an emitter contact in a part of the first resist film 14 and corresponding to a base region 6 of the first bipolar transistor region 50, implanting a first impurity from the abovenoted aperture 15, so as to form an SIC region 16 of a first conductivity type, directly below the base region 6, after forming a polysilicon layer 17 over the entire surface of the semiconductor substrate 1, implanting a first impurity into the polysilicon layer 17, after forming a second resist film 19 over the entire surface of the semiconductor substrate 1, patterning the polysilicon film 17 so as to form, in the first bipolar transistor formation region 50, an emitter electrode part 20 connected to the base region 6 as well as in the second bipolar transistor formation region 51, covering the base region 11 and the surrounding area thereof, and forming a mask layer 21 that has a closed type aperture 55 so as to expose at least part of the base region 11 in the second bipolar transistor formation region 51, implanting a second impurity into the entire surface of the semiconductor substrate 1 utilizing the second resist film 19 as a mask so as to form an SIC region 22 of a second conductivity type directly below the base region 11 in the second bipolar transistor region 51, after covering the entire surface of the semiconductor substrate 1 with an insulation layer 23, removing the insulation layer 23 by etching so as to form side walls on an emitter electrode part 20 in the first bipolar transistor formation region 50 and on the mask layer 21 in the second bipolar transistor region 51, after forming a polysilicon layer 25 over the entire semiconductor substrate 1, implanting a second impurity into the polysilicon layer 25, after forming a third resist film 40 over the entire surface of the semiconductor substrate 1, patterning the polysilicon layer 25 so as to form an emitter electrode part 26 connected to the base region 11 in the second bipolar transistor formation region 51, and heat treating the semiconductor substrate 1 so as to convert an emitter region 27 of a first conductivity type and an emitter region 28 of a second conductivity type into the first bipolar transistor formation region 50 and the second bipolar transistor formation region 51, respectively.

In a method for manufacturing a semiconductor device according to the present invention, it is desirable that the first bipolar transistor of the first conductivity type be a V-NPN transistor and that the second bipolar transistor of the second conductivity type be a V-PNP transistor.

Additionally, in a method for manufacturing a semiconductor device according to the present invention, the first impurity is one type of impurity selected from a group that includes, for example, phosphorus and arsenic.

In a method for manufacturing a semiconductor device according to the present invention, the second impurity is one type of impurity selected from a group that includes, for example, boron and fluoride.

It is desirable that the SIC region 16 of the first conductivity type formed in the first bipolar transistor formation region 50 in the method for manufacturing a semiconductor device according to the present invention be an n-type SIC region, and that the SIC region 22 of the second conductivity type formed in the second bipolar transistor formation region 51 be a p-type SIC region.

Additionally, although there is no particular restriction with regard to the shape of the closed type aperture 55 formed in the mask layer 21 used in the present invention, it is desirable that this shape be one selected from a group consisting of a circle, a rectangle, an ellipse, and a polygon.

In the method for manufacturing a semiconductor device according to the present invention, in order to form the structure to be used in the final product, it is desirable for example that a process step be added whereby the base extension regions 5 and 10, the emitter electrodes 20 and 26, and the collector extension electrodes 7 and 12 of the first and second bipolar transistor regions 50 and 51, respectively, be connected to an appropriate interconnect 32 provided externally via a plug 31 formed within the via hole 30 provided in an appropriate interlayer insulation film 29.

The method for manufacturing a semiconductor device according to the present invention is described in further detail below, with references made to FIG. 1 to FIG. 8.

Specifically, as shown in FIG. 1, the first step, similar to the method of the past, is to form a field oxide film 2 that delineates the element region on a p-type silicon substrate 1, after which the surface of the substrate 1 is oxidized to form an oxide film 3 having a thickness of 50 to 200 Angstroms.

After the above, an n-type collector region 4, high-concentration p-type base extension region 5, p-type base region 6, and high-concentration n-type collector extension region 7 of a V-NPN bipolar transistor and an n-type element separation region 8, a p-type collector region 9, a high-concentration n-type base extension region 10, an n-type base region 11, and a high-concentration p-type collector extension region 12 of a V-PNP bipolar transistor are formed.

Then, over an oxide film 13 formed to a thickness of 500 to 100 Angstroms on the entire surface, a resist 14 is formed, this being used as a mask to perform etching, so as to remove the oxide films 3 and 13, thereby forming the emitter contact 15 of the V-NPN transistor.

A resist 14 is used as a mask to ion implant phosphorus with an energy of 200 to 400 keV at a dose of 1 to $5\times10^{12}$ cm$^{-2}$, thereby forming an n-type SIC region 16.

Figure 2:
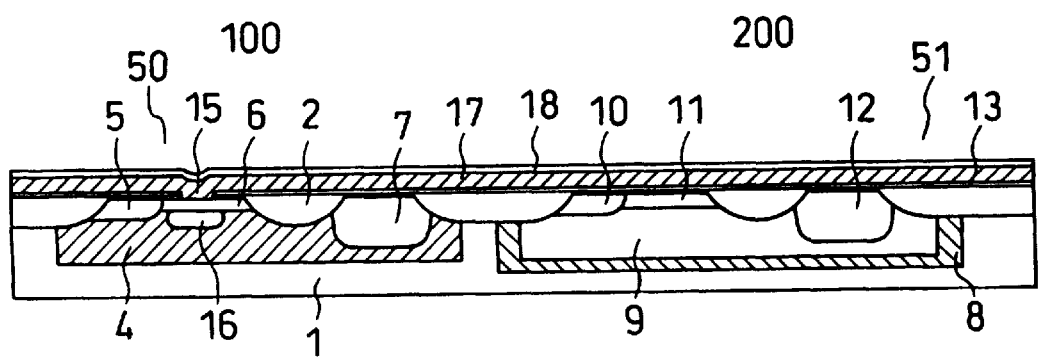
FIG. 2 is a cross-section view showing the main process steps in an example of a method for manufacturing a semiconductor device according to the present invention.

Next, as shown in FIG. 2, a polysilicon film 17 formed over the entire surface to a thickness of 2000 to 3000 Angstroms is ion implanted with arsenic with a dose of 1 to $2\times10^{16}$ cm$^{-2}$, after which an oxide film 18 of thickness 1000 to 2000 Angstroms is grown.

Figure 3:
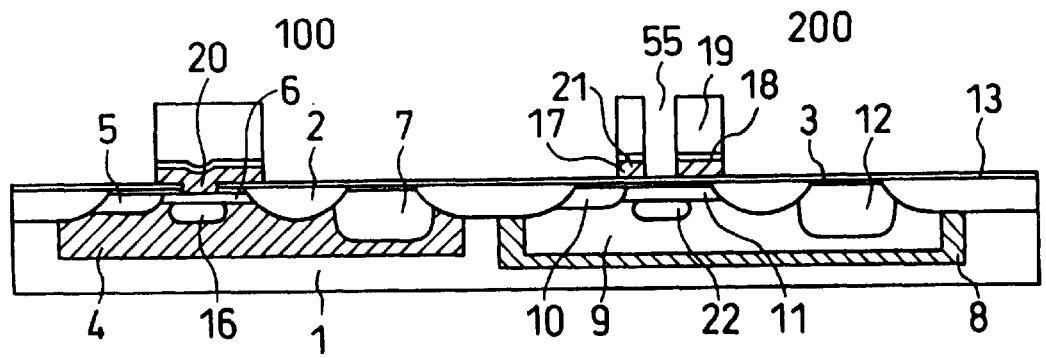
FIG. 3 is a cross-section view showing the main process steps in an example of a method for manufacturing a semiconductor device according to the present invention.

Next, as shown in FIG. 3, using a resist 19 as a mask, the oxide film 18 and polysilicon layer 17 are etched, so as to form an emitter electrode 20 of a V-NPN transistor.

Simultaneous with the above, a mask layer 21 having a ring shape viewed from the top is formed on the n-type base region 11 of the V-NPN transistor as well.

After the above, the resist 19 is used as a mask to ion implant boron with an energy of 60 to 150 keV and a dose of 1 to $5\times10^{12}$ cm$^{-2}$, thereby forming a p-type SIC region 22.

At the time of the above-noted process step, boron is ion implanted into the p-type base extension region 5 of the V-NPN transistor an the n-type base region 10 of the V-PNP transistor as well. However, because neither changes the thickness of the intrinsic base of the bipolar transistors, this has no influence on the transistor characteristics.

Figure 4:
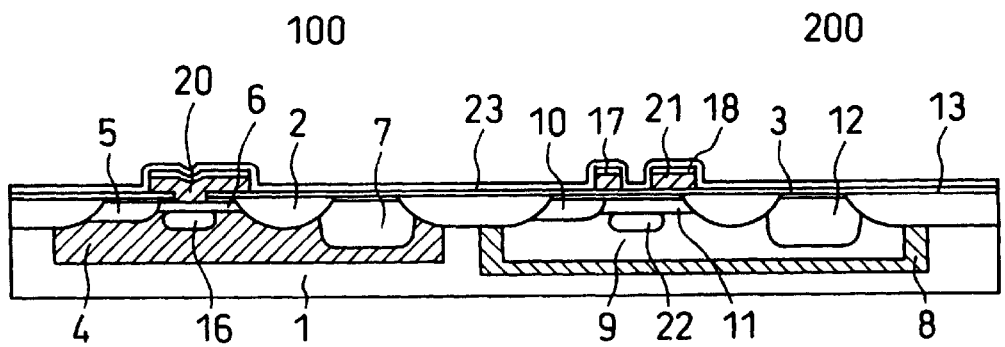
FIG. 4 is a cross-section view showing the main process steps in an example of a method for manufacturing a semiconductor device according to the present invention.

Next, an oxide film having a thickness of 500 to 1000 Angstroms is grown over the entire surface, as shown in FIG. 4.

Figure 5:
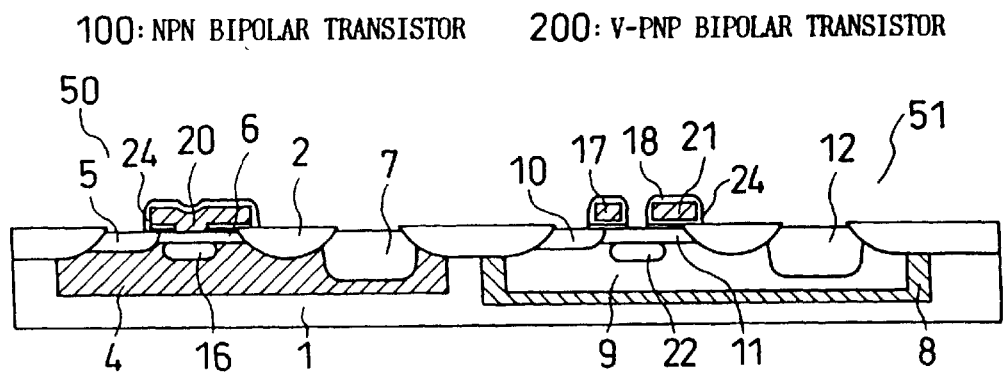
FIG. 5 is a cross-section view showing the main process steps in an example of a method for manufacturing a semiconductor device according to the present invention.

Next, as shown in FIG. 5, anisotropic dry etching is performed, so as to form a side wall 24 on an emitter electrode 20 of the V-NPN transistor and on the mask layer 21 of the V-PNP transistor.

Figure 6:
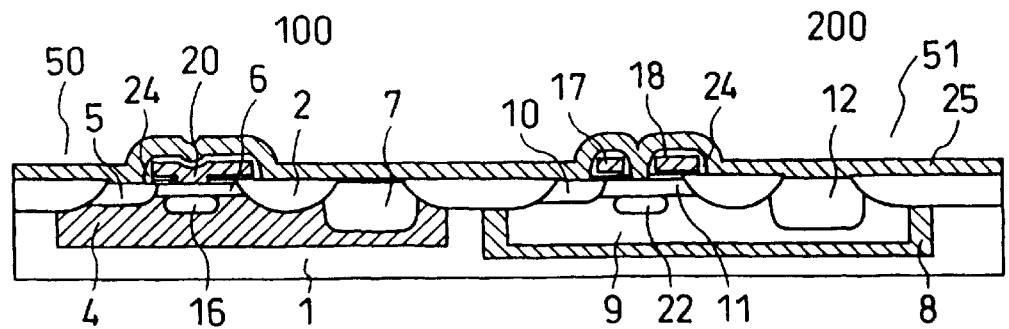
FIG. 6 is a cross-section view showing the main process steps in an example of a method for manufacturing a semiconductor device according to the present invention.

Next, as shown in FIG. 6, into the polysilicon layer 25 formed to a thickness of 2000 to 3000 Angstroms over the entire surface, boron is ion implanted, with a dose of 1 to $2\times10^{16}$ cm$^{-2}$.

Figure 7:
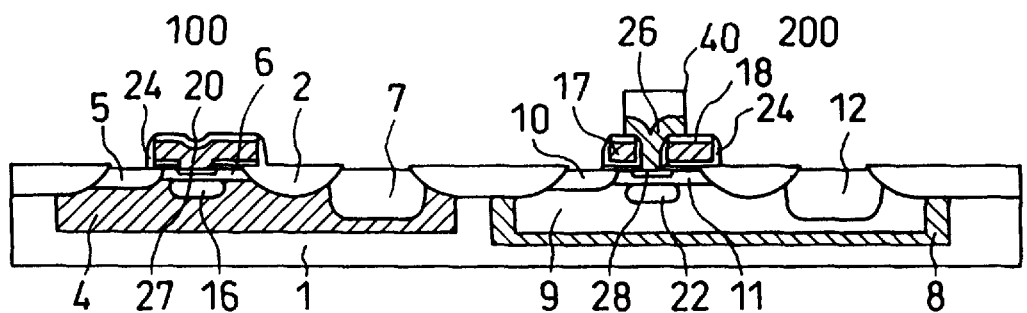
FIG. 7 is a cross-section view showing the main process steps in an example of a method for manufacturing a semiconductor device according to the present invention.

Next, as shown in FIG. 7, resist (not shown in the drawing) is used as a mask to etch the polysilicon layer 25, thereby forming an emitter electrode 26 of the V-PNP transistor. After this is done, heat treating is done at 900 to 1000° C. in a nitrogen atmosphere, so as to diffuse impurity from the polysilicon layers 17 and 25, thereby forming an n-type emitter region 27 and a p-type emitter region 28.

Figure 8:
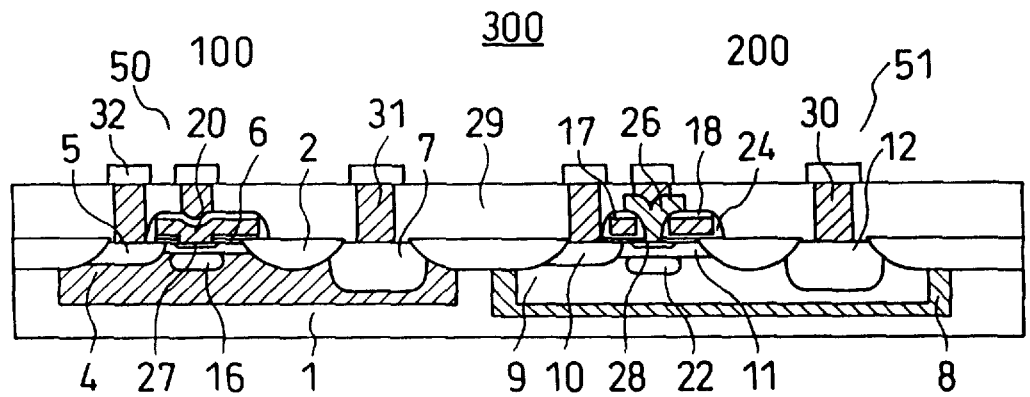
FIG. 8 is a cross-section view showing the main process steps in an example of a method for manufacturing a semiconductor device according to the present invention.

Next, in an interlayer insulation film 29 formed over the element produced by the foregoing process steps, and a contact aperture 30 is formed, after which a plug 31 is formed of tungsten or the like, and metal interconnects are formed, thereby achieving the semiconductor device shown in FIG. 8.

As shown in FIG. 1, in the method for manufacturing a semiconductor device according to the present invention, the SIC region 16 of the V-PNP transistor is formed in the same process step at which the emitter contact 15 is formed. Similarly, the SIC region 22 of the V-PNP transistor is formed in the same process step at which the emitter electrode 20 of the V-NPN transistor is formed.

Additionally, in the present invention a mask process step is not required in performing ion implantation into the polysilicon layers 17 and 25. Thus, by sharing masking process steps, it is possible to eliminate three masking steps compared with the prior art manufacturing method illustrated in FIG. 17 to FIG. 25.

Figure 26:
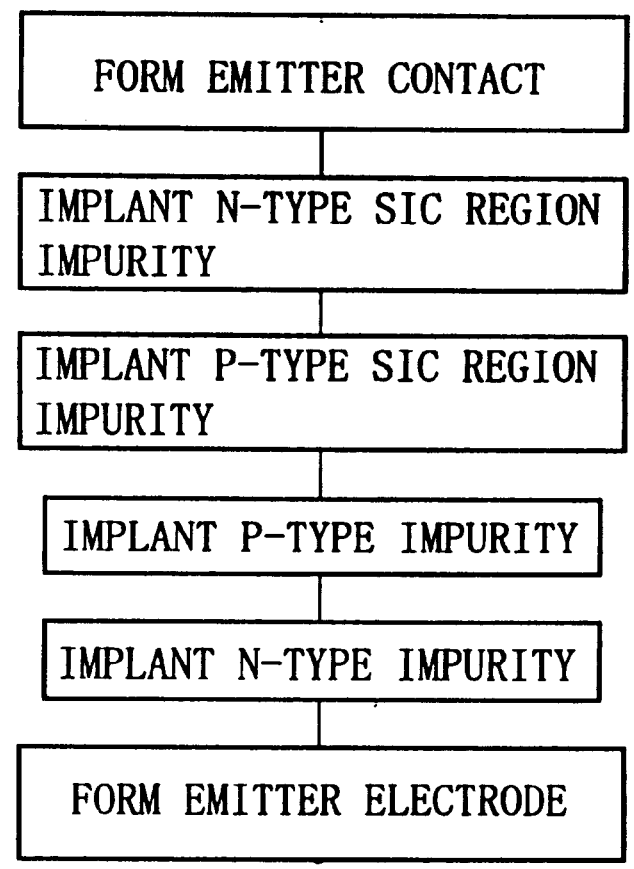
FIG. 26 is a flowchart showing the task sequence required for masking process steps in an example of a method for manufacturing a semiconductor device according to prior art.
Figure 27:
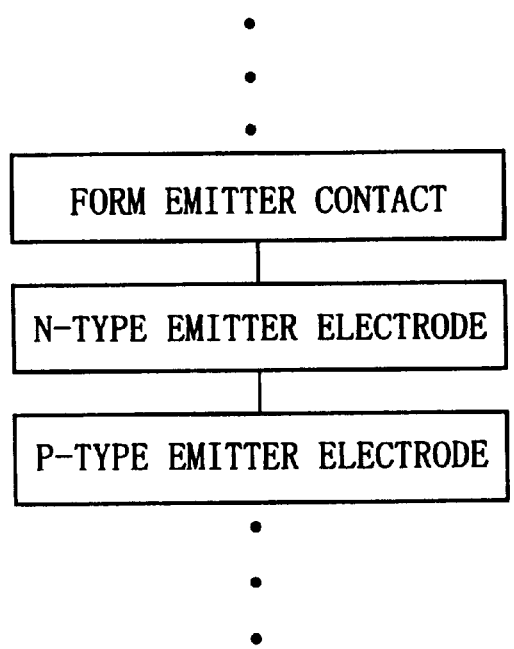
FIG. 27 is a flowchart showing the task sequence required for masking process steps in an example of a method for manufacturing a semiconductor device according to prior art.

That is, whereas with the prior art, as shown in FIG. 26, it was necessary to perform six masking process steps, with the method for manufacturing a semiconductor device according to the present invention, as shown in FIG. 27, it is sufficient to have just three masking process steps, thereby providing a simplification and shortening of the process, and a reduction of cost.

Another embodiment of a method for manufacturing a semiconductor device according to the present invention is described below, with reference made to FIG. 9 to FIG. 15.

This embodiment of is a method for manufacturing a semiconductor device 300, comprising a first bipolar transistor 100 of a first conductivity type and a second bipolar transistor 200 of a second conductivity type on one and the same substrate 1 and in mutual proximity, comprises the steps of forming on a semiconductor substrate 1 a region 50 for forming the first bipolar transistor and a region 51 for forming the second bipolar transistor, forming in the first bipolar transistor forming region 50, at least a collector region 4, a base extension region 5, a base regions 6, and a collector extension regions 7, and separately forming, in the second bipolar transistor forming region 51, at least a collector region 9, a base region 11, and a collector extension region 12, respectively, covering the top of the semiconductor substrate 1 with a first resist film 33, providing a first aperture 15 for an emitter contact and a second aperture 34 for a base contact at parts in the first resist film 33 and corresponding to the base region 6 in the first bipolar transistor region 50 and corresponding to the base region 11 in the second bipolar transistor region 51, respectively, implanting a first impurity from the apertures 15 and 34, so as to form an SIC region 35 of the first conductivity at the bottom part of the base region 6 in the first bipolar transistor region 50, after forming a polysilicon layer 17 over the entire surface of the semiconductor substrate 1, implanting a first impurity into the polysilicon layer 17, after forming a second resist film 19 over the entire surface of the semiconductor substrate 1, patterning the polysilicon film 19 so as to form, in the first bipolar transistor formation region 50, an emitter electrode part 20 connected to the base region 6, covering the base region 11 and the surrounding area thereof in the second bipolar transistor formation region 51 as well as forming a mask layer 21 having a closed type aperture so as to expose at least part of the base region 11 in the second bipolar transistor formation region 51, implanting a second impurity over the entire surface of the semiconductor substrate 1 utilizing the second resist film 19 as a mask so as to form an SIC region 37 of the second conductivity at the bottom of the base region 11 in the second bipolar transistor region 51, after covering the entire surface of the semiconductor substrate 1 with an insulation layer 23, removing the insulation layer 23 by etching, so as to form side walls on an emitter electrode part 20 in the first bipolar transistor region 50 and on the mask layer 21 in the second bipolar transistor region 51, after forming a polysilicon layer 25 over the entire semiconductor substrate 1, implanting a second impurity into the polysilicon layer 25, after forming a third resist film 40 over the entire surface of the semiconductor substrate 1, patterning the polysilicon layer 25 so as to form an emitter electrode part 26 connected to the base region 11 in the second bipolar transistor formation region 51, and heat treating the semiconductor substrate 1 so as to form an emitter region 27 of the first conductivity type and an emitter region 28 of the second conductivity type.

Note that, although in this embodiment of the present invention, the fact that the electrode structure of the V-PNP transistor formed in the second bipolar transistor region 51 is formed by the self-alignment method, is seemed to be different from that of the first embodiment, the basic configuration thereof is identical to that of the first embodiment.

The details of this embodiment are described below, with reference made to the cross-section views of FIG. 9 to FIG. 16.

Figure 9:
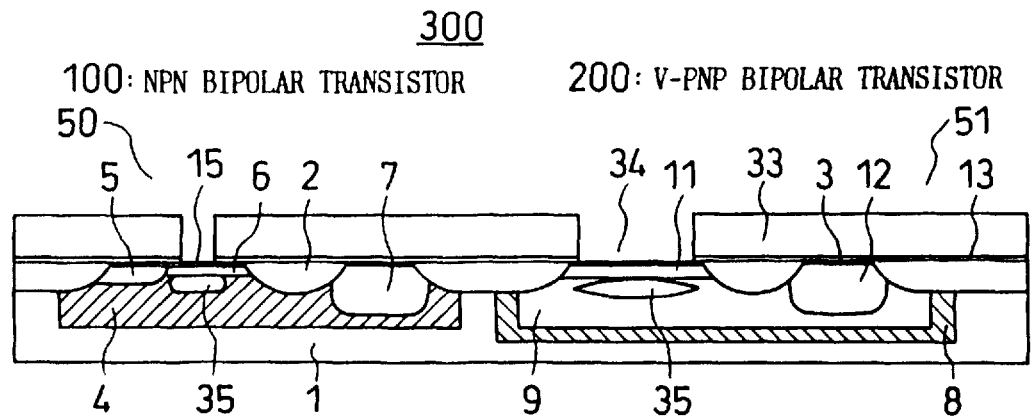
FIG. 9 is a cross-section view showing the main process steps in another example of a method for manufacturing a semiconductor device according to the present invention.

First, as shown in FIG. 9, a field oxide film 2 that delineates the element region is formed on a p-type substrate 1 by a method similar to that of the past, after which the surface of the substrate 1 is oxidized to form an oxide film 3 having a thickness of 50 to 200 Angstroms.

After the above, an n-type collector region 4, high-concentration p-type base extension region 5, a p-type base region 6, and a high-concentration n-type collector extension region 7 of a V-NPN bipolar transistor, and an n-type element separation region 8, a p-type collector region 9, an n-type base region 11, and a high-concentration p-type collector extension region 12 of a V-PNP bipolar transistor are formed.

Then, over an oxide film 13 formed to a thickness of 500 to 1000 Angstroms on the entire surface, a resist 33 is formed thereon and this being used as a mask to perform etching, thereby forming the emitter contact 15.

Simultaneously with the above, the oxide films 3 and 13 on the n-type base region of the V-PNP transistor are removed, so as to form the base contact 34.

After that, the resist 33 is used as a mask to perform ion implantation of phosphorus, with an energy of 200 to 400 keV and a dose of 1 to $5 \times 10^{12}$ cm$^{-2}$, to form the n-type SIC region 35.

Figure 10:
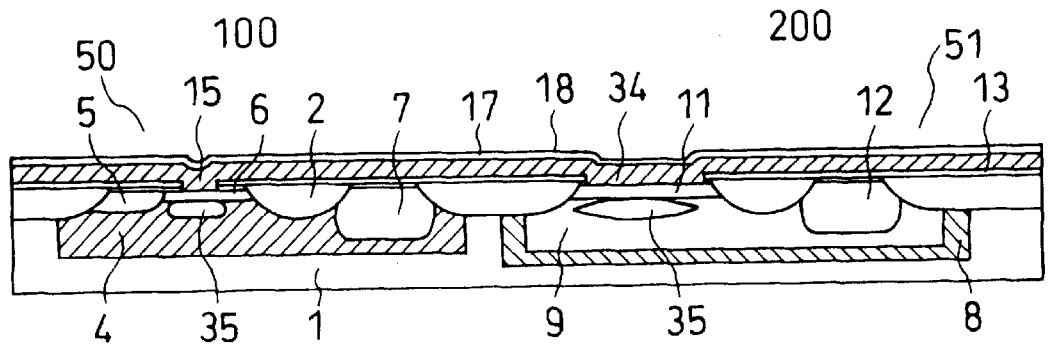
FIG. 10 is a cross-section view showing the main process steps in another example of a method for manufacturing a semiconductor device according to the present invention.

Then, as shown in FIG. 10, arsenic is ion implanted, with a dose of 1 to $2 \times 10^{16}$ cm$^{-2}$ into the polysilicon layer grown over entire surface of the substrate with a thickness of 2000 to 3000 Angstroms, after which an oxide film 18 is grown to a thickness of 1000 to 2000 Angstroms.

Figure 11:
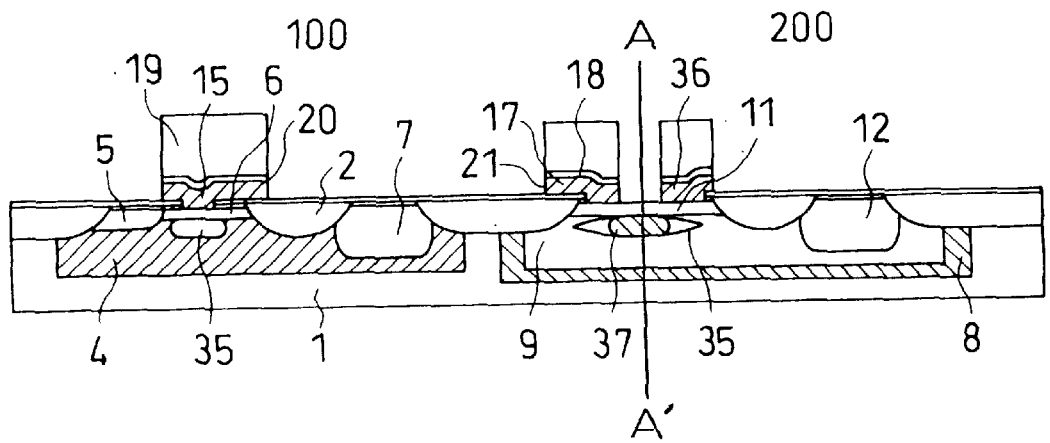
FIG. 11 is a cross-section view showing the main process steps in another example of a method for manufacturing a semiconductor device according to the present invention.

Next, as shown in FIG. 11, the resist 19 is used as a mask to etch the oxide film 18 and the polysilicon layer 17, thereby forming the emitter electrode 20 of the V-NPN transistor.

Simultaneously with the above, a base electrode 36 is formed which also serves as a mask layer 21 having a ring shape viewed from the top on the n-type base region 11 of the V-PNP transistor.

After the above, the resist 19 is used as a mask to ion implant boron with an energy of 60 to 150 keV and a dose of 1 to $5 \times 10^{12}$ cm$^{-2}$, thereby forming a p-type SIC region 37.

At the time of the above-noted process step, boron is ion implanted into the p-type base extension region 5 of the V-NPN transistor.

However, because neither changes the thickness of the intrinsic base of the bipolar transistors, this has no influence on the V-NPN transistor characteristics.

In FIG. 11, although phosphor is ion implanted into a portion around area as shown by A–A'in the process of FIG. 9, this is compensated for by the boron that is implanted in the step of FIG. 11, so that a p-type SIC region 37 is formed.

Figure 12:
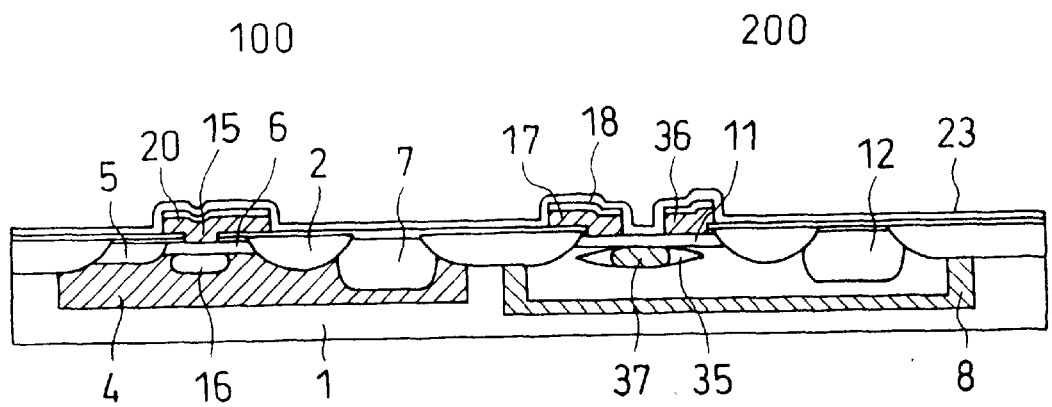
FIG. 12 is a cross-section view showing the main process steps in another example of a method for manufacturing a semiconductor device according to the present invention.

Next, as shown in FIG. 12, an oxide film 23 having a thickness of 500 to 1000 Angstroms is formed over the entire surface.

Figure 13:
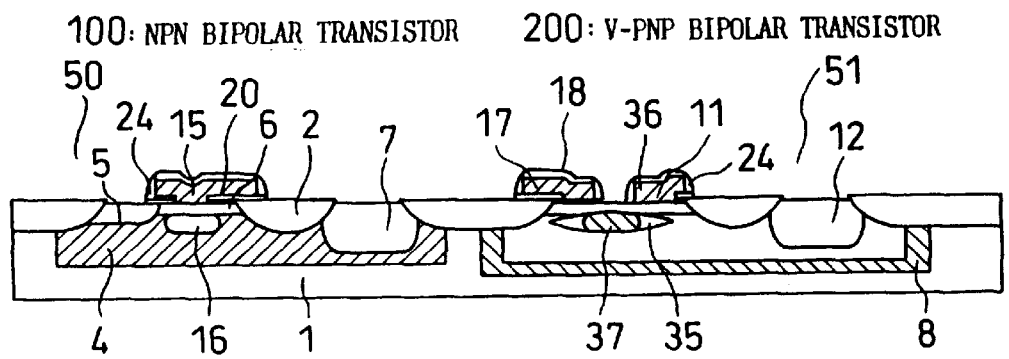
FIG. 13 is a cross-section view showing the main process steps in another example of a method for manufacturing a semiconductor device according to the present invention.

Next, as shown in FIG. 13, anisotropic dry etching is done so as to form an emitter electrode 20 of the V-NPN transistor and a side wall 24 on the side wall of the base electrode 36 of the V-PNP transistor.

Figure 14:
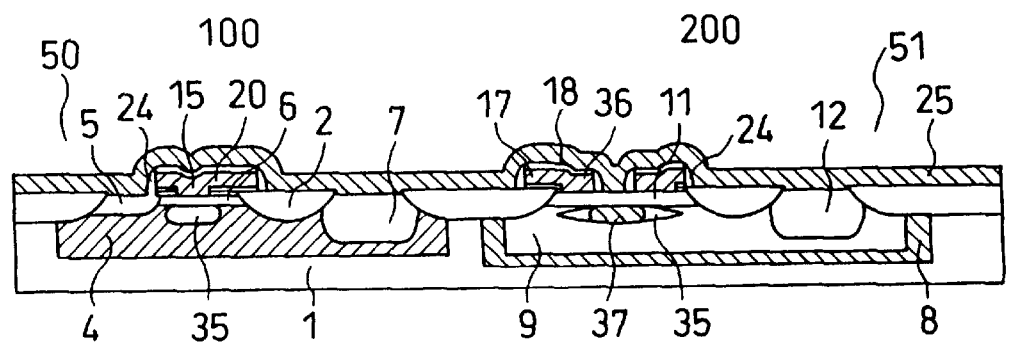
FIG. 14 is a cross-section view showing the main process steps in another example of a method for manufacturing a semiconductor device according to the present invention.

Next, as shown in FIG. 14, into the polysilicon layer 25 formed to a thickness of 2000 to 3000 Angstroms over the entire surface, boron is ion implanted, with a dose of 1 to $2 \times 10^{16}$ cm$^{-2}$.

Figure 15:
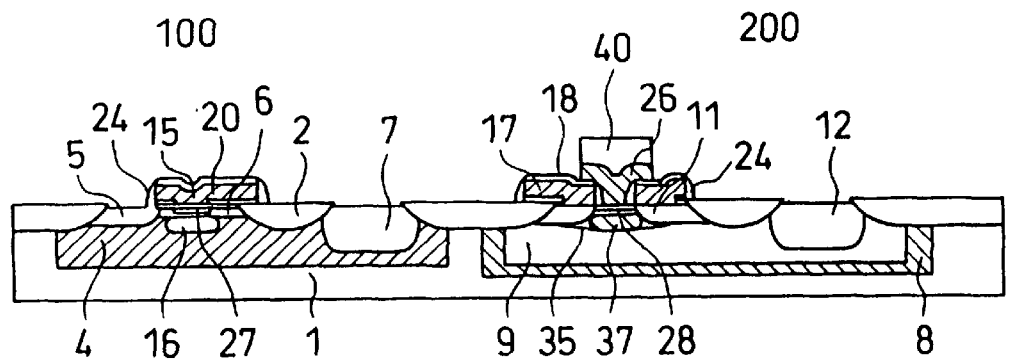
FIG. 15 is a cross-section view showing the main process steps in another example of a method for manufacturing a semiconductor device according to the present invention.

Next as shown in FIG. 15, resist 26 is used as a mask to etch the polysilicon layer 25, thereby forming the emitter electrode 26 of the V-PNP transistor.

After the above, heat treating is done at 900 to 1000° C. in a nitrogen atmosphere, so as to diffuse impurities from the polysilicon layers 17 and 25, thereby forming an n-type emitter region 27 and a p-type emitter region 28.

Figure 16:
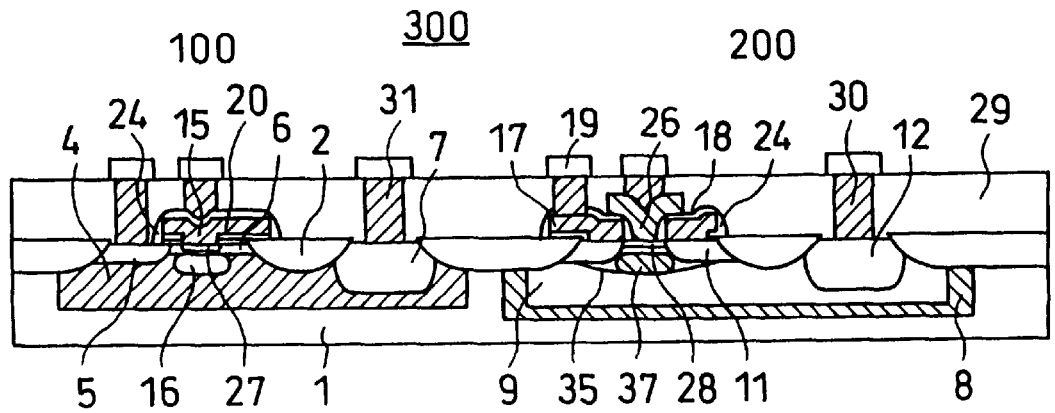
FIG. 16 is a cross-section view showing the main process steps in another example of a method for manufacturing a semiconductor device according to the present invention.
Figure 17:
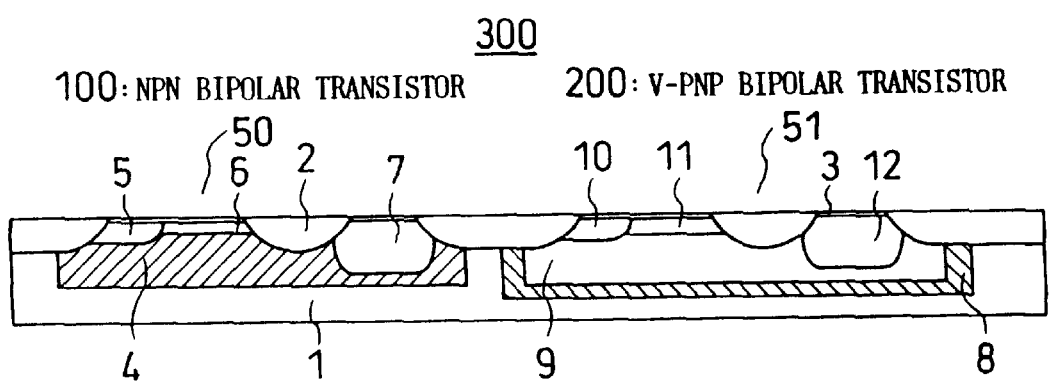
FIG. 17 is a cross-section view showing the main process steps in another example of a method for manufacturing a semiconductor device according to the present invention.
Figure 18:
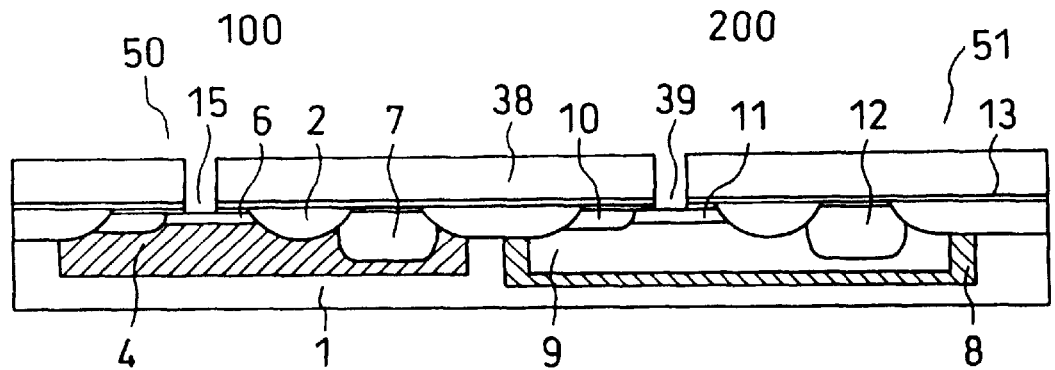
FIG. 18 is a cross-section view showing the main process steps in an example of a method for manufacturing a semiconductor device according to prior art.
Figure 19:
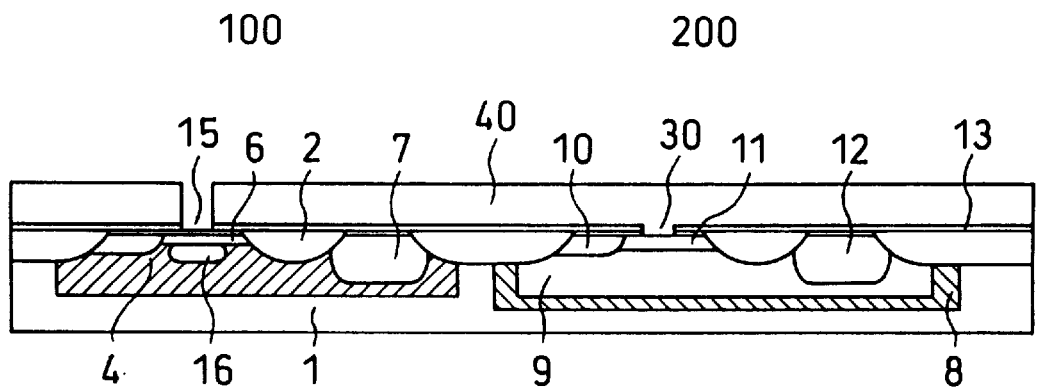
FIG. 19 is a cross-section view showing the main process steps in an example of a method for manufacturing a semiconductor device according to prior art.
Figure 20:
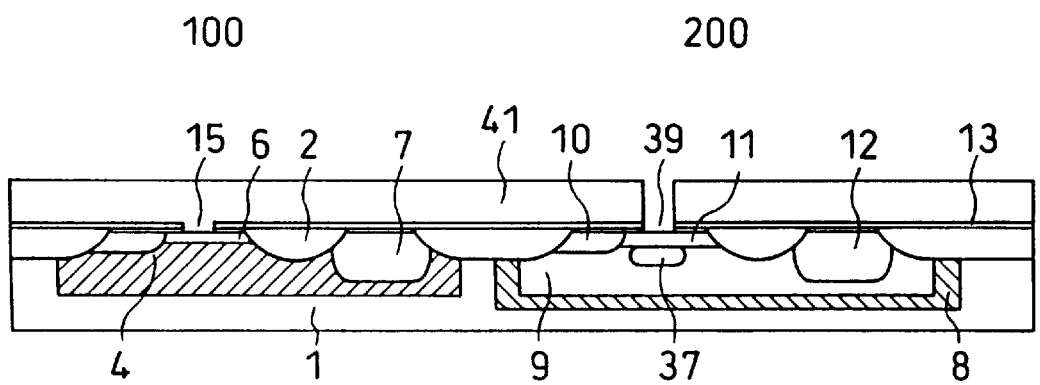
FIG. 20 is a cross-section view showing the main process steps in an example of a method for manufacturing a semiconductor device according to prior art.
Figure 21:
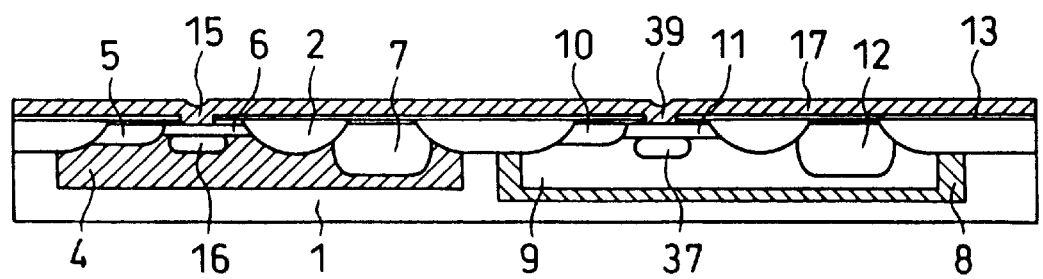
FIG. 21 is a cross-section view showing the main process steps in an example of a method for manufacturing a semiconductor device according to prior art.
Figure 22:
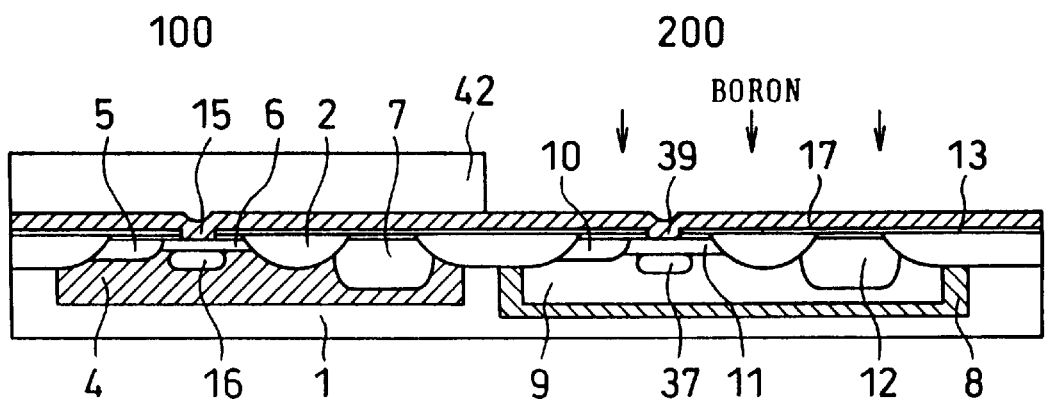
FIG. 22 is a cross-section view showing the main process steps in an example of a method for manufacturing a semiconductor device according to prior art.
Figure 23:
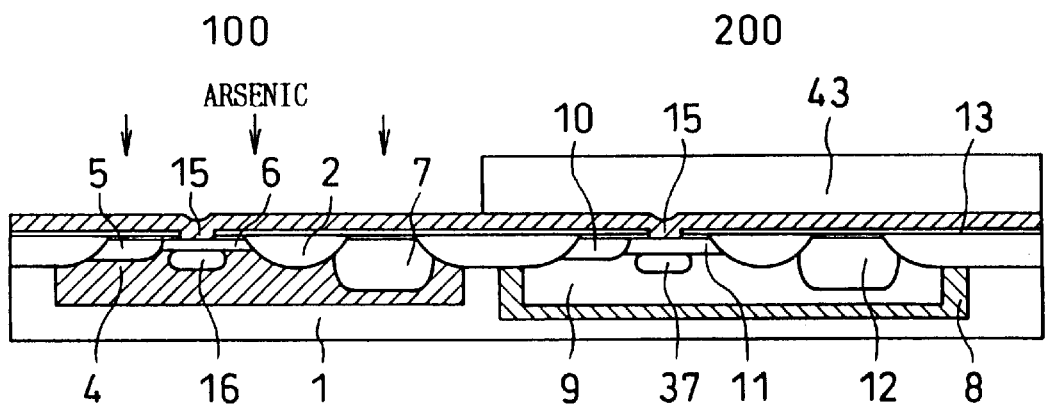
FIG. 23 is a cross-section view showing the main process steps in an example of a method for manufacturing a semiconductor device according to prior art.
Figure 24:
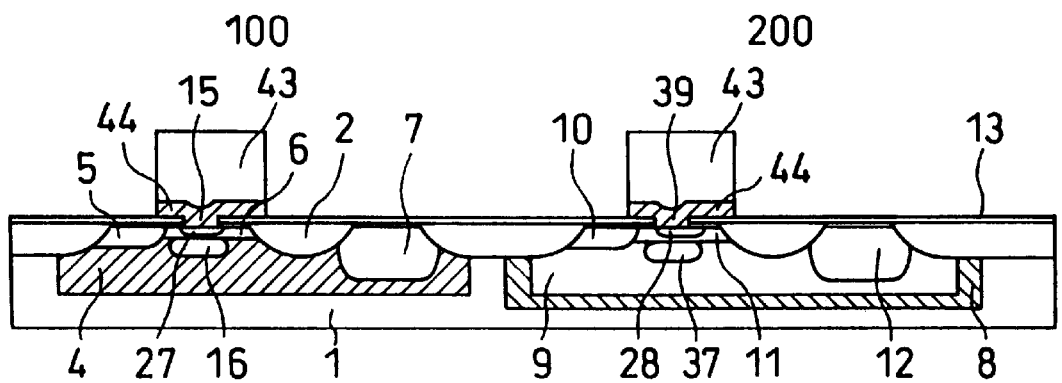
FIG. 24 is a cross-section view showing the main process steps in an example of a method for manufacturing a semiconductor device according to prior art.
Figure 25:
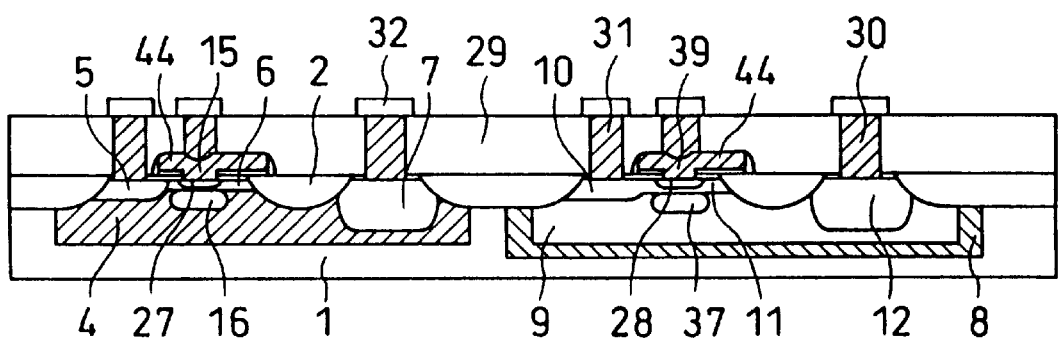
FIG. 25 is a cross-section view showing the main process steps in an example of a method for manufacturing a semiconductor device according to prior art.

Next, in an interlayer insulation film 29 formed over the element produced by the foregoing process steps, a contact aperture 30 is formed, after which a plug 31 is formed of tungsten or the like, and metal interconnects 32 are formed, thereby achieving the semiconductor device shown in FIG. 16.

According to the above-described method for manufacturing a semiconductor device, it is possible to form a high-performance self-aligned V-PNP transistor with the same number of added masking steps as in the embodiment shown in FIG. 1.

By adopting the constitution described in detail above, the method for manufacturing a semiconductor device according to the present invention enables a reduction in the number of masking process steps used for forming high-performance V-PNP and V-NPN transistors on a single substrate.

That is, compared to the method for manufacturing this type of device in the past, the present invention enables the number of masking steps to be halved, thereby enabling simplification and shortening of the manufacturing process and reduction of the cost.

What is claimed is:

1. A method for manufacturing a semiconductor device having a first bipolar transistor of a first conductivity type and a second bipolar transistor of a second conductivity type on one and the same substrate and in mutual proximity, comprising:

forming on a semiconductor substrate a region for forming said first bipolar transistor and a region for forming said second bipolar transistor and minimally separately forming in each transistor forming region, a collector region, a base extension region, a base region, and a collector extension region;

covering the top of said semiconductor substrate with a first resist film and providing an aperture for an emitter contact in a part of the first resist film and corresponding to a base region of said first bipolar transistor;

implanting a first impurity into said aperture, so as to form an SIC region of said first conductivity type at the bottom of the base region;

forming a polysilicon layer over the entire surface of said semiconductor substrate, and then implanting a first impurity into said polysilicon layer;

forming a second resist film over the entire surface of said semiconductor substrate, and then patterning said polysilicon layer so as to form in said first bipolar transistor formation region an emitter electrode part connected to said base region, and forming a mask layer that, in said second bipolar transistor formation region, covers a base region and the surrounding area, and that has a closed type aperture so as to expose at least a part of said base region in said second bipolar transistor formation region;

using said second resist film as a mask to implant a second impurity over the entire surface of said semiconductor substrate, and form an SIC region of a second conductivity type at the bottom of the base region in said second bipolar transistor region;

covering the entire surface of said semiconductor substrate with an insulation layer, and then removing said insulation layer by etching, so as to form a side wall on an emitter electrode part in said first bipolar transistor formation region and on said mask layer in said second bipolar transistor region;

forming a polysilicon layer over the entire semiconductor substrate, and then implanting into said polysilicon layer a second impurity;

forming a third resist film over the entire surface of said semiconductor substrate, and patterning said polysilicon layer, thereby forming an emitter region connected to said base region in said second bipolar transistor forming region; and heat treating said semiconductor substrate to form an emitter region of said first conductivity type and an emitter region of said second conductivity type.

2. A method for manufacturing a semiconductor device according to claim 1, wherein said first bipolar transistor of said first conductivity is a V-NPN transistor and wherein said second bipolar transistor of said second conductivity is an V-PNP transistor.

3. A method for manufacturing a semiconductor device according to claim 1, wherein said first impurity is selected from a group consisting of phosphorus and arsenic and wherein said second impurity is selected from a group consisting of boron and boron fluoride.

4. A method for manufacturing a semiconductor device according to claim 1, wherein said SIC region of said first conductivity is an n-type SIC region, and wherein said SIC of said second conductivity is a p-type SIC region.

5. A method for manufacturing a semiconductor device according to claim 1, wherein the shape of said aperture of said mask is selected as one of a group of shapes consisting of a circle, a rectangle, an ellipse, and a polygon.

6. A method for manufacturing a semiconductor device according to claim 1, further comprising:

electrically connecting each of said base extension electrodes, emitter electrodes, and collector extension electrodes formed in each of said first and second bipolar transistor regions to an external interconnect; and forming via plugs in via holes provided in an interlayer insulation film over said electrodes.

7. A method for manufacturing a semiconductor device having a first bipolar transistor of a first conductivity type and a second bipolar transistor of a second conductivity type on one and the same substrate and in mutual proximity, comprising:

forming on a semiconductor substrate a region for forming said first bipolar transistor and a region for forming said second bipolar transistor, minimally forming separately in said first bipolar transistor region a collector region, a base extension region, a base region, and a collector extension region, and minimally forming separately in said second bipolar transistor region a collector region, a base region, and a collector extension region;

covering the top of said semiconductor substrate with a first resist film and in said first resist film, providing a first aperture and a second aperture for an emitter contact formed on a portion corresponding to a base region in said first bipolar transistor region and for a base contact formed on a portion corresponding to a base region in said second bipolar transistor region, respectively;

implanting a first impurity into said first aperture, so as to form an SIC region of said first conductivity type at the bottom of said base region in said first bipolar transistor region;

forming a polysilicon layer over the entire surface of said semiconductor substrate, and then implanting a first impurity into said polysilicon layer;

forming a second resist film over the entire surface of said semiconductor substrate, and then patterning said polysilicon layer to form in said first bipolar transistor formation region an emitter electrode part connected to said base region, and forming a mask layer that, in said second bipolar transistor formation region, covers a base region and the surrounding area thereof, and that has a closed type aperture so as to expose at least part of said base region in said second bipolar transistor formation region;

using said second resist film as a mask to implant a second impurity over the entire surface of said semiconductor substrate, and form an SIC region of a second conductivity type at the bottom of the base region in said second bipolar transistor region;

covering the entire surface of said semiconductor substrate with an insulation layer, and then removing said insulation layer by etching, so as to form a sidewall on an emitter electrode part in said first bipolar transistor region and on said mask layer in said second bipolar transistor region;

forming a polysilicon layer over the entire semiconductor substrate, and then implanting into said polysilicon layer a second impurity;

forming a third resist film over the entire surface of said semiconductor substrate, and patterning said polysilicon layer, thereby forming an emitter electrode portion connected to said base region in said second bipolar transistor forming region; and heat treating said semiconductor substrate to form an emitter region of said first conductivity and an emitter region of said second conductivity.

8. A method for manufacturing a semiconductor device according to claim 2, wherein said first bipolar transistor of said first conductivity is a V-NPN transistor and wherein said second bipolar transistor of said second conductivity is an V-PNP transistor.

9. A method for manufacturing a semiconductor device according to claim 2, wherein said first impurity is selected from a group consisting of phosphorus and arsenic and wherein said second impurity is selected from a group consisting of boron and boron fluoride.

10. A method for manufacturing a semiconductor device according to claim 2, wherein said SIC region of said first conductivity is an n-type SIC region, and wherein said SIC of said second conductivity is a p-type SIC region.

11. A method for manufacturing a semiconductor device according to claim 2, wherein the shape of said aperture of said mask is selected as one of a group of shapes consisting of a circle, a rectangle, an ellipse, and a polygon.

12. A method for manufacturing a semiconductor device according to claim 2, further comprising:

electrically connecting each of said base extension electrodes, emitter electrodes, and collector extension electrodes formed in each of said first and second bipolar transistor regions to an external interconnect; and forming via plugs in via holes provided in an interlayer insulation film over said electrodes.

* * * * *